(12) United States Patent
Nairn

(10) Patent No.: US 7,250,885 B1
(45) Date of Patent: Jul. 31, 2007

(54) SYSTEM AND METHOD FOR USING TIMING SKEW ESTIMATION WITH A NON-SEQUENTIAL TIME-INTERLEAVED ANALOG-TO-DIGITAL CONVERTER

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/396,821

(22) Filed: Apr. 3, 2006

(51) Int. Cl.
*H03M 1/00* (2006.01)
(52) U.S. Cl. ...................... 341/141; 341/155
(58) Field of Classification Search ......... 341/131–160
See application file for complete search history.

(56) References Cited

U.S. PATENT DOCUMENTS

| | | | |
|---|---|---|---|
| 4,763,105 A * | 8/1988 | Jenq | 341/120 |
| 4,968,988 A * | 11/1990 | Miki et al. | 341/141 |
| 5,294,926 A * | 3/1994 | Corcoran | 341/120 |
| 5,764,775 A * | 6/1998 | Kim | 381/1 |
| 6,392,575 B1 * | 5/2002 | Eklund | 341/141 |
| 6,771,203 B1 * | 8/2004 | Nairn | 341/159 |
| 7,053,804 B1 | 5/2006 | Nairn | |
| 7,126,511 B2 * | 10/2006 | Draxelmayr et al. | 341/136 |
| 7,138,933 B2 * | 11/2006 | Nairn | 341/141 |
| 2005/0190089 A1 * | 9/2005 | Draxelmayr et al. | 341/141 |
| 2006/0097901 A1 * | 5/2006 | Draxelmayr et al. | 341/155 |
| 2006/0238397 A1 * | 10/2006 | Nairn | 341/155 |

OTHER PUBLICATIONS

Jin H Lee; time interleaved (a/d) with channel randommization; IEEE 1997 vol. 1, pp. 425-428.*
Tamba Shimizu; A method to Improve SFDR with Random Interleaved Sampling; Oct. 2001, pp. 512-520.*
El-Sankary Assi; "New sampling method to improve SFDR of time interleaved ADCs" 2003 International Symposium vol. 1 pp. 833-836.*
Hummels D.M Mcdonald; "Distortion compensation of time interleaved adc" IEEE 1996 vol. 1 pp. 728-731.*

* cited by examiner

*Primary Examiner*—Lam T. Mai
(74) *Attorney, Agent, or Firm*—Gauthier & Connors LLP

(57) ABSTRACT

A multi-channel analog-to-digital converter system includes an array of sub-analog-to-digital converters wherein within the array of sub-analog-to-digital converters, there is at least one designated reference analog-to-digital converter. The analog-to-digital converter system also includes a non-sequential channel select circuit to control a selection of the analog-to-digital converters and the reference analog-to-digital converter to non-sequentially interleave the outputs of said analog-to-digital converters and said reference analog-to-digital converter. Each channel of the plurality of sub-analog-to-digital converters includes a timing skew estimation circuit. Each timing skew estimation circuit receives an output signal from the reference analog-to-digital converter and receives the output signal from the associated analog-to-digital converter. Each timing skew estimation circuit generates a timing signal to be used in shifting or adjusting the actual or apparent sample times for the appropriate analog-to-digital converter.

38 Claims, 8 Drawing Sheets

SYSTEM AND METHOD FOR USING TIMING SKEW ESTIMATION WITH A NON-SEQUENTIAL TIME-INTERLEAVED ANALOG-TO-DIGITAL CONVERTER

FIELD OF THE PRESENT INVENTION

The present invention is directed to a multi-channel analog-to-digital converter system using a very high sampling rate. More particularly, the present invention is directed to a multi-channel time-interleaved analog-to-digital converter system that utilizes a non-minimal length time-interleaving sequence and a two-channel timing skew estimation algorithm.

BACKGROUND OF THE PRESENT INVENTION

Time-interleaving has long been recognized as an attractive technique for implementing analog-to-digital converter systems with very high sampling rates. However, to realize low distortion, the sample time skews between the different channels must be well matched. Since the channels' sample times will vary with temperature, supply voltage, and aging, it is desirable to monitor or estimate the timing skews during the normal operation of the system such that timing skew corrections can be made, as needed. While a number of simple timing skew estimation algorithms exist for two-channel time-interleaved analog-to-digital converter systems, the algorithms are not well suited for systems with more than two channels.

In a conventional time-interleaved multi-channel analog-to-digital converter system, a plurality of sub-analog-to-digital converters is operated in parallel, as shown in FIG. 1. As FIG. 1 illustrates, a conventional time-interleaved multi-channel analog-to-digital converter system includes multiple channels, four in this example (A, B, C, and D). Each channel includes a sub-analog-to-digital converter (32, 34, 36, and 38). Each sub-analog-to-digital converter (32, 34, 36, and 38) is connected to a clock and sequential selector circuit 10. The clock and sequential selector circuit 10 provide the clock signal for each sub-analog-to-digital converter (32, 34, 36, and 38) and the selection signal so that the appropriate channel is selected to produce the digital signal 40 for output from the time-interleaved multi-channel analog-to-digital converter system. Moreover, an analog signal, from an analog input 20, is input to each sub-analog-to-digital converter (32, 34, 36, and 38).

The conventional timing for the four channels shown in FIG. 1 is illustrated in FIG. 2. As illustrated in FIG. 2, the samples are assumed to be taken on the rising edge of the system clock and on the falling edge of the channel clocks (Clk-A, Clk-B, Clk-C, and Clk-D).

Based upon the illustrated sequence, if each sub-analog-to-digital converter (32, 34, 36, and 38) has a maximum sample rate of $f_c$, the time-interleaved multi-channel analog-to-digital converter system can achieve a system sample rate of $f_s = M*f_c$, wherein M is the number of channels or number of sub-analog-to-digital converters.

As illustrated in FIG. 2, the conventional timing sequence utilizes a minimal length sequence for which the repeat rate of the timing pattern is equal to the number of elements in the array. Consequently, when M ADCs are used, the ADCs are used sequentially and the pattern repeats every M samples. When a minimal length sequence is used in a time-interleaved analog-to-digital converter, one may refer to such a system as a sequential time-interleaved analog-to-digital converter. Utilizing a minimal length sequence ensures that each ADC samples the input as soon as possible when the time-interleaved system is clocked at its maximum rate.

In such a time-interleaving system, the analog-to-digital converter system can achieve a very high sampling rate. However, to realize low distortion, the sub-analog-to-digital converters used in a time-interleaved system must be well matched. More specifically, to realize low distortion, it is important that the sample times of the sub-channels be equally spaced as shown in FIG. 2.

Deviations from the ideal spacing, often referred to as timing skews, lead to the generation of spurious tones. Spurious tones limit the spurious free dynamic range of the overall time-interleaved multi-channel analog-to-digital converter system. The frequency of the input signal, $f_i$, and the magnitude of the timing skews, $\Delta T$, limits the spurious free dynamic range. This relationship is governed by: SFDR=$-20 \log(2\pi(f_i)(\Delta T))$ wherein SFDR is the spurious free dynamic range.

For example, if a system has a timing skew of one pico-second and an input signal of 250 MHz, the spurious free dynamic range will be limited to 56 dB. It is noted that the sample rate ($f_s$) has no effect on the spurious free dynamic range.

Conventionally, spurious free dynamic range is improved by reducing the timing skews. To effectively reduce the timing skews, first the skews must be determined or estimated. Thereafter, the timing skews are corrected. Although, skews can be determined and corrected before using an analog-to-digital converter, this is undesirable because the timing skews may shift with time and with changes in operating conditions such as supply voltage and temperature.

Consequently, it is desirable to estimate and correct the timing skews while the analog-to-digital converter system is normally operating without the use of special calibration signals. For example, for a two-channel system, timing skews have been conventionally estimated and corrected during normal operations by correlation techniques and multipliers. These techniques are based on the use of two-channel timing skew estimation algorithms or more simply two-channel skew estimators. Although these conventional approaches are well suited for two-channel systems, the conventional approaches do not work well when extended to systems with more than two channels due to Nyquist limitations.

When M=2, the estimation techniques used to detect timing skews rely on mathematical operations on adjacent samples. In a two channel system, any pair of adjacent samples will be composed of one sample from the reference analog-to-digital converter and one sample from the slave analog-to-digital converter. Ideally, these samples are spaced $1/f_s$ apart. One such algorithm estimates the timing skew by taking the difference between a sum of the magnitudes of the sum of the reference channel's sample and the following sample from the slave channel and a sum of the magnitudes of the sum of the slave channel's sample and the following sample from the reference channel. The sign of the estimate indicates the direction of the timing skew and the magnitude of the estimate is related to the magnitude of the timing skew.

When M>2, the spacing between the various channels is no longer $1/f_s$. For example, when M=4, the spacing between the reference channel and either a first channel or a third channel is $1/f_s$, and $3/f_s$, while the spacing between the reference channel and the second channel is $2/f_s$.

Since the spacing between the reference channel and any other channel is no longer approximately $1/f_s$, for the M>2 case, the common two channel skew estimators must be modified if they are to be applied to these systems.

There are two direct ways to modify the common two channel skew estimators. The first approach is to band-limit the system's input to only part of the system's full Nyquist zone. Such a solution would be applicable in some applications, but not all. The second approach is to use the components of the estimation to first determine which sub-band of the full Nyquist zone most of the energy lies. Then the appropriate sign of the estimate can be determined.

However, neither approach is well suited to broadband applications in which signal energy is approximately uniformly distributed over the Nyquist band.

An alternate approach to improving the spurious free dynamic range is to use channel randomization. When channel randomization is used, the sequence in which the channels are used is random or pseudo-random. However, channel randomization reduces the spurious tones by converting the spurious tones to noise. This additional noise can have a negative impact upon the output of the multi-channel system. If the mismatches in a system using channel randomization are significant, the resulting degradation in the noise, from the conversion of the spurious tones to noise, may be unacceptable. The solution to the degradation, as noted above, is to estimate and correct the timing skews.

Thus, it is desirable to find an alternate solution to the problem of extending timing skew estimation algorithms for two channel systems to the multi-channel case. This would enable the timing skews to be estimated and corrected during normal operations of a multi-channel system (more than two channels) to ensure acceptable matching and to obtain the desired level of performance.

SUMMARY OF THE PRESENT INVENTION

A first aspect of the present invention is a time interleaved analog-to-digital converter system including an analog input, a clock input, and a digital output. The time interleaved analog-to-digital converter system further includes a non-sequential channel selection circuit, operatively connected to the clock input, to generate channel selection signals; a plurality of analog-to-digital converters, operatively connected to the analog input, to the non-sequential channel selection circuit, and to the clock input, to receive the analog input, a channel selection signal, and a clock signal, each analog-to-digital converter being associated with a channel, each analog-to-digital converter receiving a different channel selection signal; a reference analog-to-digital converter, operatively connected to the non-sequential channel selection circuit, to the analog input, and to the clock input, to receive an analog input signal, a channel selection signal, and a clock signal; a plurality of clock sequence detection circuits, operatively connected to the non-sequential channel selection circuit, to receive the clock signal, a channel selection signal, and the channel selection signal received by the reference analog-to-digital converter, each clock sequence detection circuit being associated with one of the plurality of analog-to-digital converters that receives the same channel selection signal; a plurality of timing skew estimation circuits, operatively connected to the reference analog-to-digital converter, to receive an output from the reference analog-to-digital converter and to generate a timing skew estimate, each timing skew estimation circuit being operatively connected to one of the plurality of clock sequence detection circuits and being associated with one of the plurality of analog-to-digital converters, each timing skew estimation circuit receiving an output from the associated analog-to-digital converter; and a selection circuit operatively connected to the plurality of analog-to-digital converters, the reference analog-to-digital converter, and the non-sequential channel selection circuit. The selection circuit selects one output from the plurality of the analog-to-digital converters and the reference analog-to-digital converter to be provided to the digital output in response to the channel selection signals.

A second aspect of the present invention is a method for determining frequency and timing characteristics of the channels in a time interleaved analog to digital converter system. The method inputs an analog signal; non-sequentially selects the channels, one at a time to sample the analog signal and to generate a digital output signal based upon the sampled analog signal; selects one of the channels as a reference channel; determines a timing skew difference between the samples represented by the output of the reference channel and the samples represented by the output of one or more of the non-reference channels; and generates a timing skew correction signal based upon the determined timing skew difference.

A third aspect of the present invention is a method for determining frequency and timing characteristics of the channels in a time interleaved analog to digital converter system. The method inputs an analog signal; non-sequentially selects the channels one at a time to sample the analog input signal and to generate a digital output signal based upon the sampled analog signal; selects one of the channels as a reference channel; determines a frequency response difference between the samples represented by the output of the reference channel and the samples represented by the output of one or more of the non-reference channels; and generates a frequency response correction signal based upon the determined frequency response difference.

A fourth aspect of the present invention is a multi-channel analog-to-digital converter. The multi-channel analog-to-digital converter includes a plurality of analog-to-digital converters to receive an analog input signal, each analog-to-digital converter being associated with a channel; a reference analog-to-digital converter to receive an analog input signal; a non-sequential channel selection circuit, operatively connected to the each analog-to-digital converter and the reference analog-to-digital converter, the non-sequential channel selection circuit controlling a selection of the analog-to-digital converters and the reference analog-to-digital converter to non-sequentially interleave the times at which the analog-to-digital converters and the reference analog-to-digital converter sample the analog input; a clock sequence indication circuit to determine a timing relationship between a sample represented by the output of the reference analog-to-digital converter and the samples represented by the outputs of the analog-to-digital converters; and a plurality of timing skew estimation circuits operatively connected to the reference analog-to-digital converter, the non-sequential channel selection circuit, the clock sequence indication circuit and the analog-to-digital converters, each timing skew estimation circuit being associated with one of the analog-to-digital converters. Each timing skew estimation circuit receives an output from the reference analog-to-digital converter, the associated analog-to-digital converter, and the clock sequence indication circuit. Each timing skew estimation circuit generating an associated timing skew estimation signal corresponding to a timing error between the reference analog-to-digital converter and the associated analog-to-digital converter when the timing relationship between the sample represented by the output of the reference analog-to-digital converter and the sample represented by the output of the associated analog-to-digital converter is a predetermined timing relationship.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE INVENTION

Figure 1:
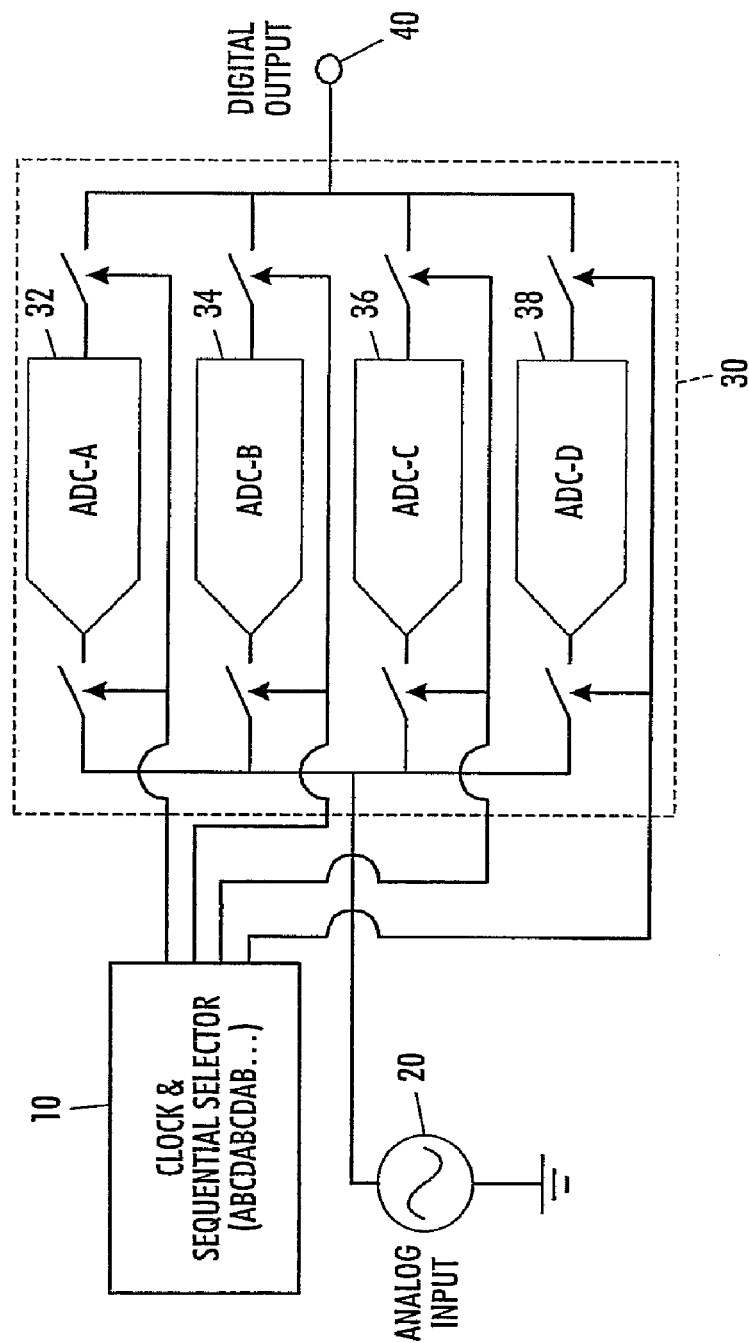
FIG. 1 illustrates a prior art time-interleaved multi-channel analog-to-digital converter system.
Figure 2:
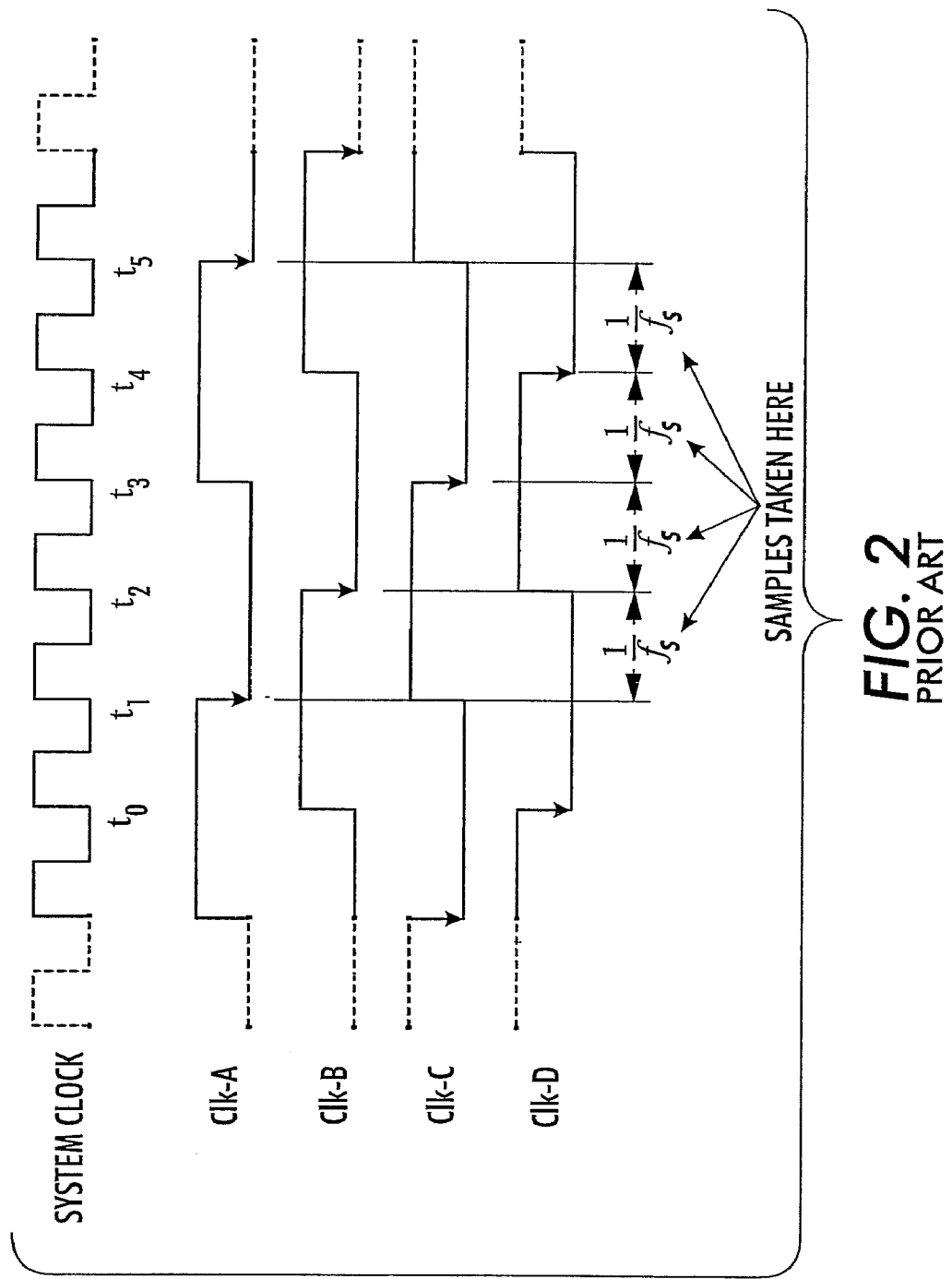
FIG. 2 illustrates sequential timing for the prior art time-interleaved multi-channel analog-to-digital converter system of FIG. 1.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

As noted above, it is desirable for the timing skews to be estimated and corrected during normal operations of a multi-channel system (more than two channels) to ensure acceptable matching and to obtain the desired level of performance. By utilizing a non-sequential interleaving sequence, a simple two-channel skew estimator can be used in a multi-channel system to avoid the problems associated with extending two channel skew estimators to conventional sequential interleaving systems with more than two channels.

For the purpose of this description, a sequential sequence is defined as a sequence whose repeat length or period is equal to the number of elements used in the sequence. Such a sequence is also a minimal length sequence. For example if the system contains three elements, A, B and C, examples of sequential sequences would include; A B C A B C A B . . . and A C B A C B A C . . . In each case the period of the sequence equals three, the number of elements.

For the purpose of this description, a non-sequential sequence is a sequence that has a repeat length or period that is greater than the number of elements used in the sequence. It is noted that channel randomization, is an example of a non-sequential time-interleaving sequence.

Figure 3:
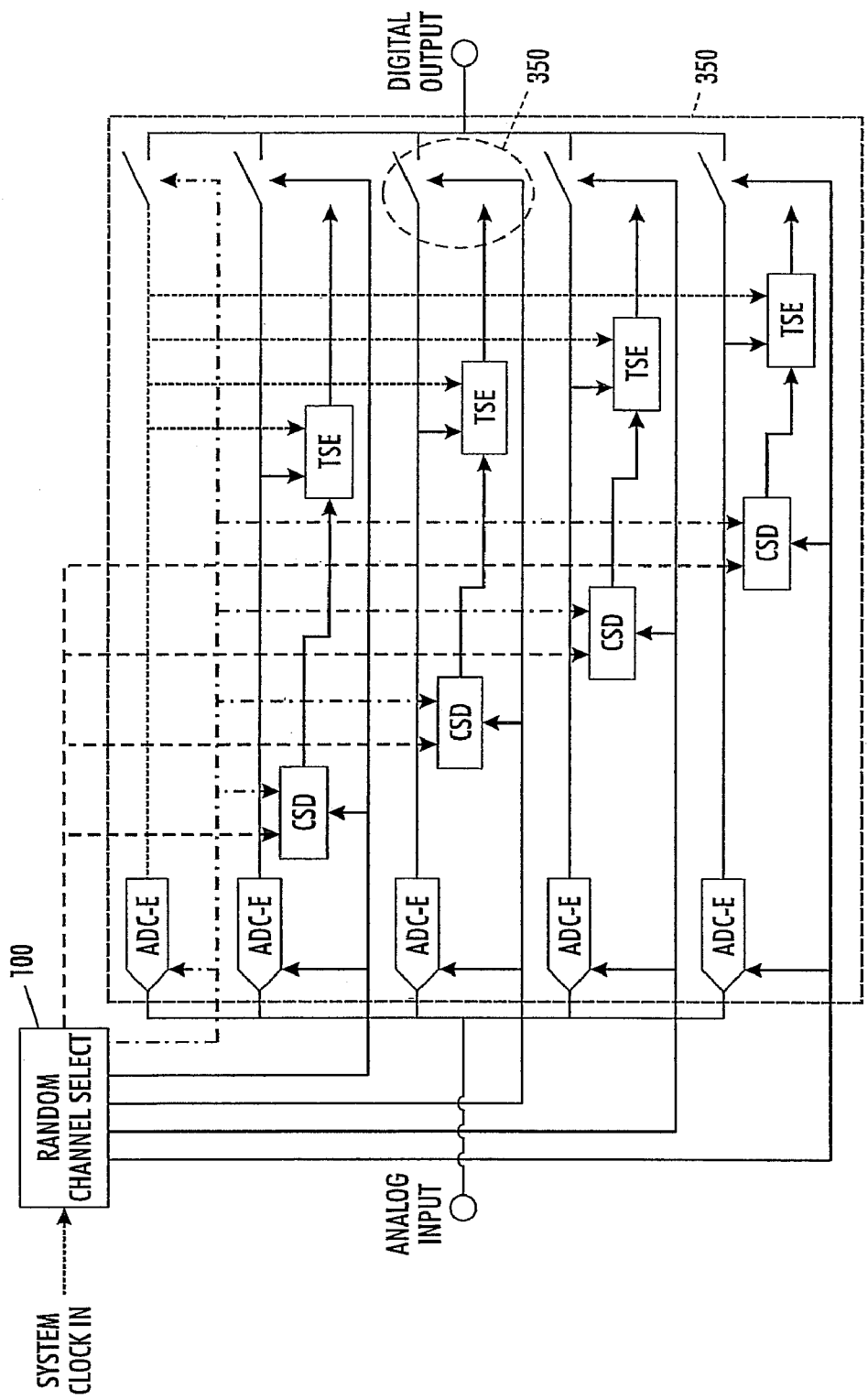
FIG. 3 illustrates a non-sequential time-interleaved multi-channel analog-to-digital converter system according to the concepts of the present invention.

As illustrated in FIG. 3, a non-sequential interleaving sequence can be used to enable the use of two-channel timing skew estimators to function properly in multi-channel time-interleaved ADC systems.

More specifically, as illustrated in FIG. 3, to ensure that the maximum sampling rate of $M*f_c=f_s$ is maintained, at least one additional analog-to-digital converter, ADC-E must be added to the plurality of sub-analog-to-digital converters, (ADC-A, ADC-B, ADC-C, and ADC-D). Alternatively, the maximum sample rate would have to be reduced to enable the use of a non-sequential interleaving sequence.

The multi-channel analog-to-digital converter system of FIG. 3 includes an array of sub-analog-to-digital converters 300. Within the array of sub-analog-to-digital converters one analog-to-digital converter, ADC-A, is defined as the reference analog-to-digital converter. The analog-to-digital converter system also includes a non-sequential channel select circuit 100 for controlling the timing or clocking of the array of sub-analog-to-digital converters 300.

The non-sequential channel select circuit 100 may generate a plurality of individual clock signals and provide one of the individual clock signals to each sub-analog-to-digital converter. Alternatively, the non-sequential channel select circuit 100 may generate a plurality of individual gating signals and provide one of the individual gating signals to each sub-analog-to-converter. In the latter case, the single master clock signal is also provided to each sub-analog-to-digital converter.

The non-sequential channel select circuit 100 controls the timing or clocking of the array of sub-analog-to-digital converters 300 to interleave the times when the various channels sample the analog input so that the sequence in which the various channels sample the analog input is not strictly sequential, as defined earlier. The non-sequential interleaving of the sampling sequence of the various channels may be random, pseudo-random, ordered, or periodic. Moreover, the interleaving sequence of the reference channel's sampling times, with respect to the sample times of the non-reference channels may be random, pseudo-random, ordered, or periodic.

For example, if A is the reference channel and B, C, D, and E are the other channels of the multi-channel analog-to-digital converter system, a non-sequential interleaving sequence of the sample times of the various channels may be the sequence ( . . . A B C D A E B C A D E B A C D E A A B . . . ). In this example, the non-sequential interleaving of the sampling sequence of the various non-reference channels is not purely random because a requirement has been imposed wherein the reference channel, A, operates at $f_s/4$. In addition a further requirement has been imposed wherein each slave channel takes one sample that immediately follows a sample by the reference channel, one sample that is midway between two consecutive samples taken by the reference channel and one sample immediately preceding a sample taken by the reference channel, in any period of sixteen consecutive samples. Note that the repeat length of this sequence is sixteen, which is significantly greater than five, the number of elements used in the array.

As illustrated in FIG. 3, each channel of the plurality of sub-analog-to-digital converters (ADC-B, ADC-C, ADC-D, and ABC-E) includes a clock sequence detection circuit (CSD). Each clock sequence detection circuit (CSD) receives the appropriate individual clock signal for its associated channel and the clock signal for the reference channel. Alternatively, each clock sequence detection circuit receives the appropriate gating signal for its associated channel and the gating signal for the reference channel, along with a system clock signal.

Moreover, each channel of the plurality of sub-analog-to-digital converters (ADC-B, ADC-C, ADC-D, and ABC-E) includes a two-channel timing skew estimator circuit (TSE). Each timing skew estimation circuit (TSE) receives the output signal from the reference analog-to-digital converter ADC-A and receives the output signal from the associated analog-to-digital converter (ADC-B, ADC-C, ADC-D, or ABC-E). Each timing skew estimation circuit (TSE) generates a timing skew estimate based upon the received output signals. The timing estimate can be used to correct the timing error of its associated analog-to-digital converter (ADC-B, ADC-C, ADC-D, or ABC-E).

For the above-described non-sequential sequence approach, the M>2 analog-to-digital converters (ADC-A, ADC-B, ADC-C, ADC-D, and ABC-E) in the interleaved system use a sequence that ensures each analog-to-digital converter (ADC-B, ADC-C, ADC-D, or ABC-E) takes some samples that immediately precede the reference analog-to-digital converter's (ADC-A) samples and also take some samples that immediately follow the reference analog-to-digital converter's (ADC-A) samples. By collecting the associated channel's samples and the reference channel's samples, when their samples are adjacent, and noting their order, a two-channel timing skew estimator can be used to estimate the timing skew between the associated channel and the reference channel. The timing skew estimate can then be used adjust the timing of the associated channel's sample times relative to the reference channel's sample times.

As noted before although a random or pseudo-random sequence may be preferred, it is not strictly necessary so long as the sequence is non-sequential and the number of immediately preceding samples is equal to, or approximately equal to the number of immediately following samples in any extended period of time.

Figure 4:
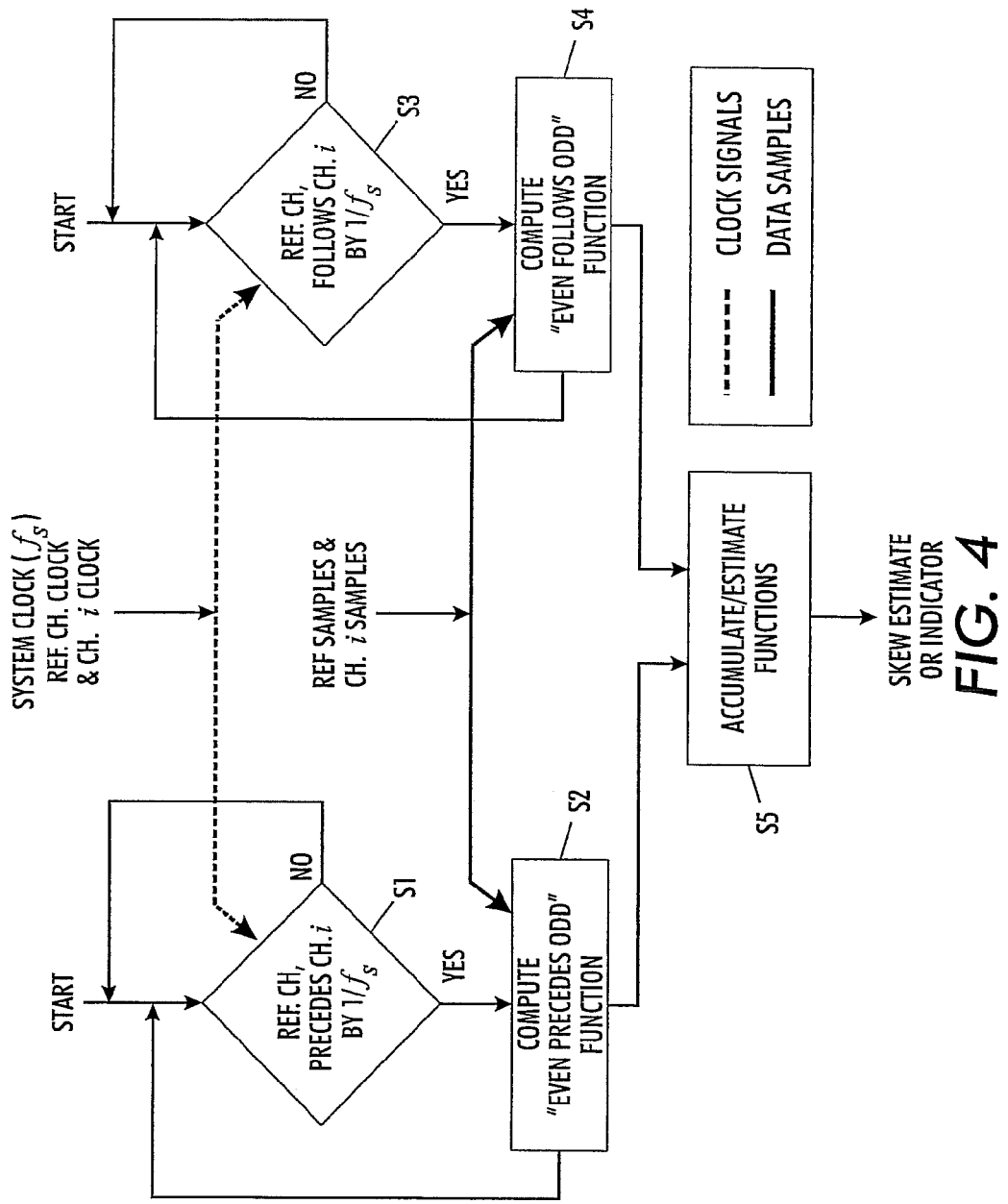
FIG. 4 is a flowchart illustrating a clock sequence detection suitable for use in the present invention.

To better understand the operation of the present invention, the operations of a clock sequence detector circuit and a timing skew estimation circuit, as illustrated in FIG. 4, will be discussed. The operations of a clock sequence detection circuit and a two-channel timing skew estimator illustrated in FIG. 4 rely upon two concepts.

First, since it is only the timing skew differences and not the timing skew absolute values that are important, one channel can be used as the reference channel and the non-reference channel's timing skew is adjusted to match the reference channel's timing skew.

Second, simple two-channel timing skew estimators rely on two types of pair-wise samples. The first type of samples is where the non-reference channel's samples precede the reference channel's samples. These sample pairs may be referred to as the channel-preceding-reference sample pairs. The second type of samples is where the non-reference channel's samples follow the reference channel's samples. This second type of sample pair may be referred to as the channel-following-reference sample pairs. Provided a collection of channel-preceding-reference sample pairs and of channel-following-reference sample pairs can be collected that are similar in nature to the samples from a two-channel time-interleaved analog-to-digital converter system, a two-channel-timing skew estimator can be used in a multi-channel time-interleaved analog-to-digital converter system.

To apply these two concepts to a multi-channel time-interleaved system, a non-sequential interleaving sequence is used to control the sequence in which the sub analog-to-digital converters sample the analog input and one of the sub analog-to-digital converters is identified as the reference channel. More specifically, by using a clocking sequence that ensures that each of the analog-to-digital converters (ADC-B, ADC-C, ADC-D, or ABC-E of FIG. 3) takes some samples that immediately precede the reference analog-to-digital converter's (ADC-A of FIG. 3) samples and the analog-to-digital converters (ADC-B, ADC-C, ADC-D, or ABC-E of FIG. 3) also takes some samples that immediately follow the reference analog-to-digital converter's (ADC-A of FIG. 3) samples, a collection of channel-preceding-reference sample pairs and of channel-following-reference sample pairs can be collected for inputs to a two-channel timing skew estimator.

In one example of implementing the timing skew estimation, each channel, except the reference channel, includes a clock sequence detector. As illustrated by FIG. 4, the clock sequence detector determines if the current sample either immediately precedes the reference channel's sample (step S1) or immediately follows the reference channel's sample (step S3). If the sample immediately precedes (step S1) (or follows (step S3)) the reference channel's sample, the appropriate pair-wise operations (step S2 or S4) are performed on the two samples. The results are passed to the accumulator or estimator block (step S5) for further processing to determine the timing skew estimation.

As noted above, each channel, except the reference channel, includes a clock sequence detector and timing skew estimator. The information from the timing skew estimator can be used to correct the timing skews of the corresponding channel. The timing skew correction can be done using either a feedback structure, as illustrated in FIGS. 5 and 6 or by using a feedforward structure as illustrated in FIG. 7.

Figure 5:
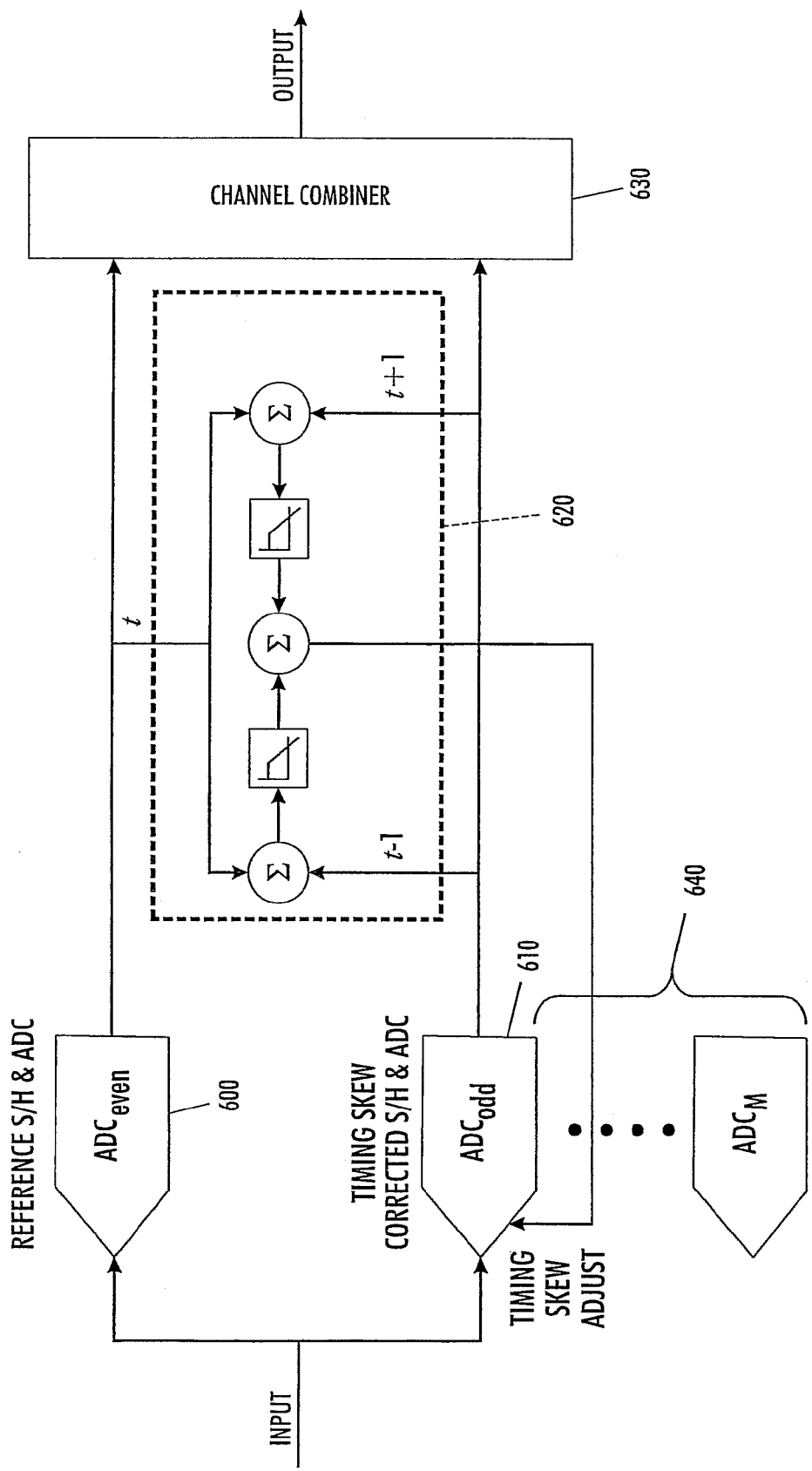
FIG. 5 is a block diagram illustrating a non-sequential time-interleaved multi-channel analog-to-digital converter system with an analog closed-loop feedback system according to the concepts of the present invention.
Figure 6:
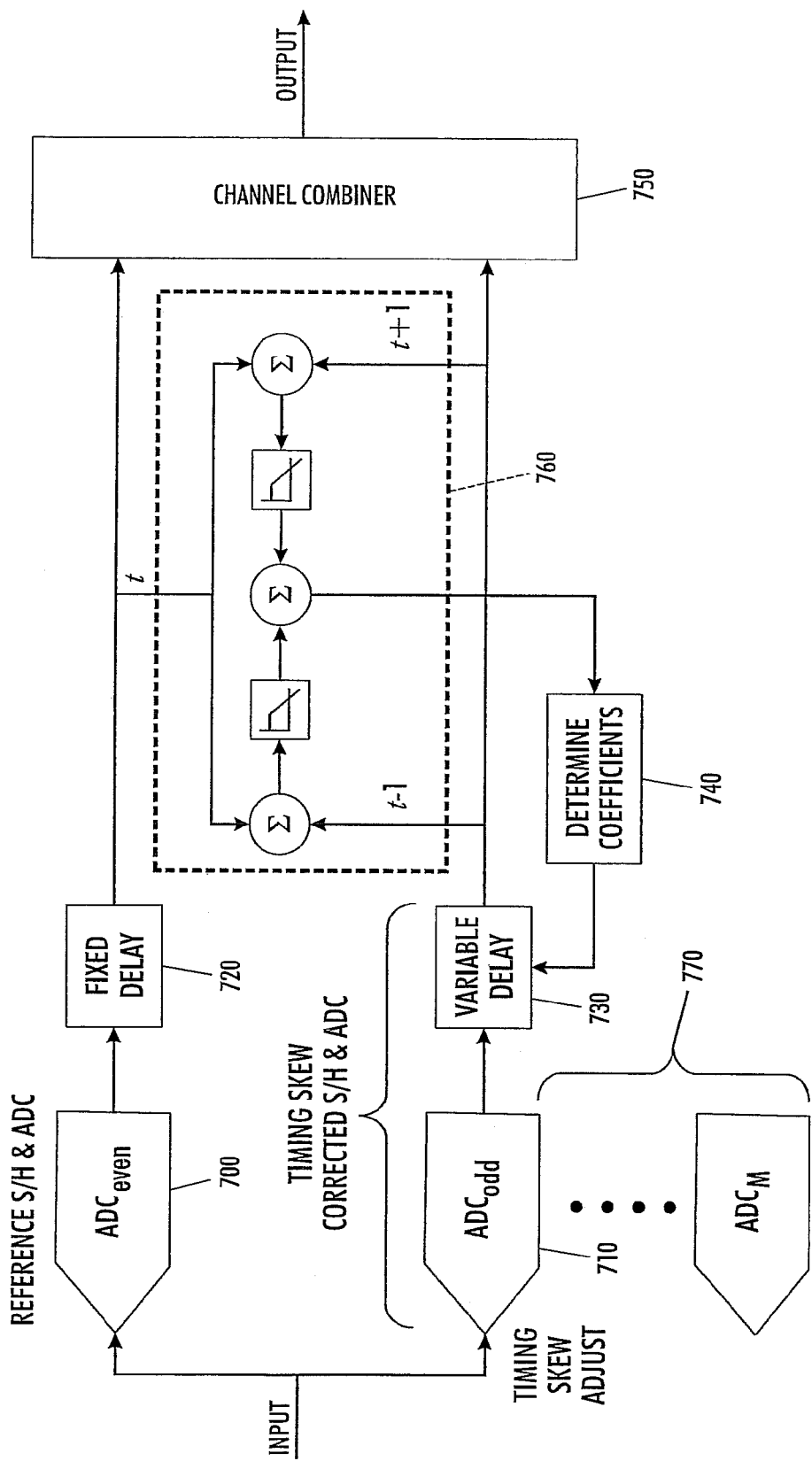
FIG. 6 is a block diagram illustrating a non-sequential time-interleaved multi-channel analog-to-digital converter system with a digital closed-loop feedback system according to the concepts of the present invention.
Figure 7:
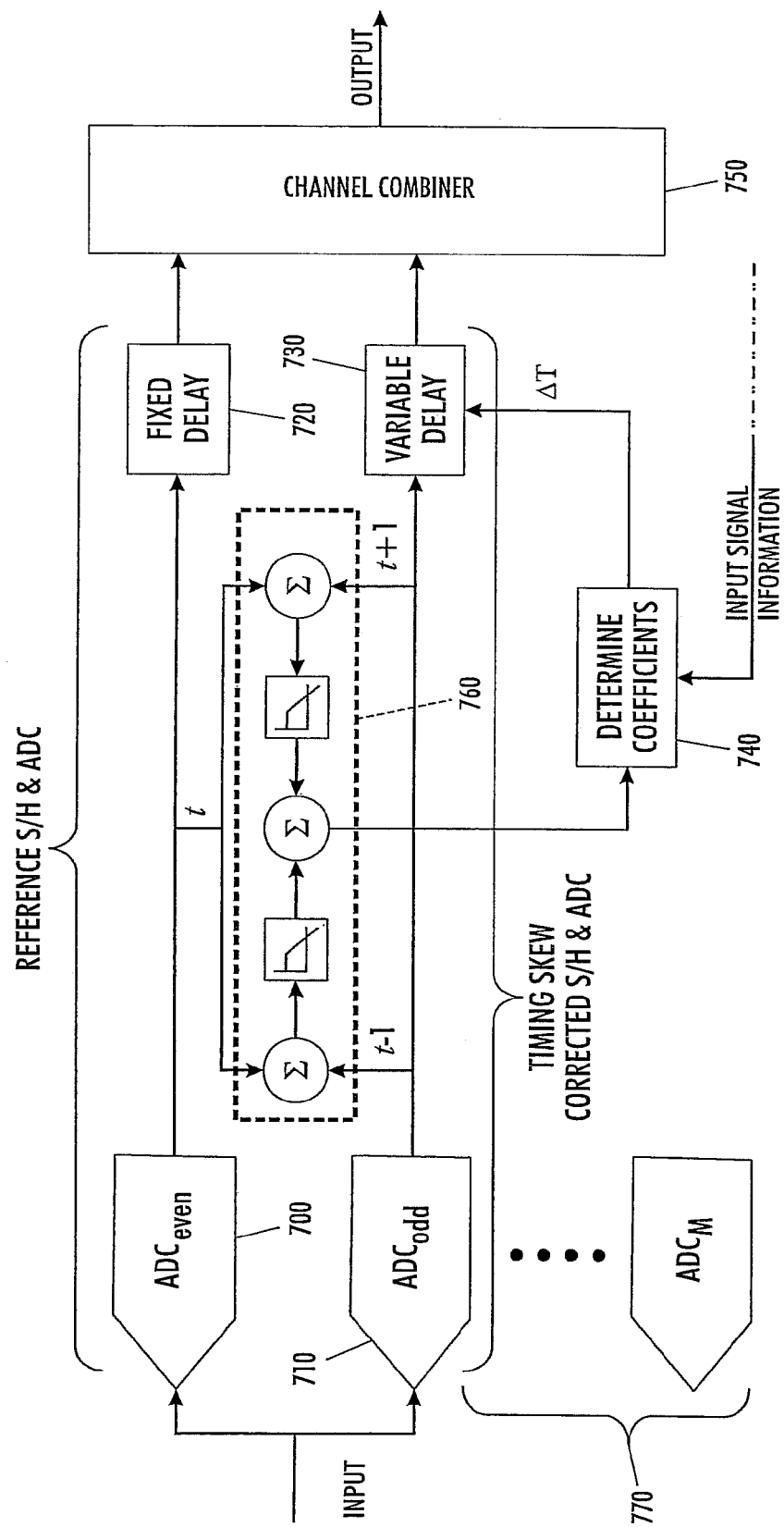
FIG. 7 is a block diagram illustrating another a non-sequential time-interleaved multi-channel analog-to-digital converter system with a digital open-loop feed forward system according to the concepts of the present invention.

As illustrated in FIGS. 5-7, in each of the systems, one channel (600 or 700) is selected as the timing reference channel. The other channels' sample times are adjusted such that the timing skews of the other channels (610 or 710) match that of the reference channel (600 or 700). This technique can be done with or without information about the input signal.

If the system has no additional knowledge about the input signal, the channel's timing skew can be corrected with an analog skew adjustment in a closed loop system that includes a clock sequence detector, a timing skew estimator and an analog delay element, as shown in FIG. 5. Alternatively, the timing skew can be corrected with a digital timing skew adjustment in a closed loop system that includes a clock sequence detector, a timing skew estimator, and a digital fractional delay filter as shown in FIG. 6.

In many systems, information is known about the signal in advance or determined from digital signal processing that is done after the interleaved analog-to-digital converter system. When information is known, or is determined about the signal, it is possible to combine the timing skew estimate with information about the signal to determine the actual value of ΔT. When the actual value of ΔT can be determined, an open-loop system, such as that shown in FIG. 7, can be used to correct the timing skew.

In FIG. 5, a multi-channel analog-to-digital converter system includes a reference analog-to-digital converter 600 and a sub-analog-to-digital converter 610, one of a plurality (M) of sub-analog-to-digital converters 640. The reference analog-to-digital converter 600 and the plurality of sub-analog-to-digital converters 640 receive an analog input and generate a digital output. A channel combiner 630 receives each output and produces the appropriate digital output for the multi-channel analog-to-digital converter system.

As noted above, the multi-channel analog-to-digital converter system includes a timing or clock sequence detector circuit and a timing skew estimator circuit 620 which provides an estimate of the timing skew.

The clock sequence detector determines when the sub analog-to-digital converter 610 has taken a sample at t−1 that immediately precedes the sample taken by the reference channel, at t. When this first timing condition is met, the timing skew estimator circuit 620 receives the output, from the reference analog-to-digital converter, that is the digital representation of the sample of the analog input taken at time t by the reference analog-to-digital converter 600. In addition, the timing skew estimator circuit 620 also receives the output from the sub analog-to-digital converter 610 that is the digital representation of the sample of the analog input taken at time t−1 by the sub analog-to-digital converter 610. The two digital outputs received by the timing skew estimator may be referred to as the channel-preceding-reference sample pair.

Within the timing skew estimator, the channel-preceding-reference sample pair is summed. The magnitude of the sum is then added to the sum of the previous magnitudes of the sums of adjacent samples where the sub analog-to-digital converter's sample of the analog input immediately precedes the sample of the analog input taken by the reference analog-to-digital converter. This result may be referred to as the first accumulated sum.

In addition, the clock sequence detector determines when the sub analog-to-digital converter 610 has taken a sample at t+1 that immediately follows the sample taken by the reference channel, at t. When this second timing condition is met, the timing skew estimator circuit 620 receives the output, from the reference analog-to-digital converter, that is the digital representation of the sample of the analog input taken at time t taken by the reference analog-to-digital converter 600. In addition, the timing skew estimator circuit 620 also receives the output from the sub analog-to-digital converter 610 that is the digital representation of the sample of the analog input taken at time t+1 by the sub analog-to-digital converter 610. The two digital outputs received by the timing skew estimator may be referred to as the channel-follows-reference sample pair.

Within the timing skew estimator, the channel-following-reference sample pair is summed. The magnitude of the sum is then added to the sum of the previous magnitudes of the sums of the channel-following-reference sample pairs. This result may be referred to as the second accumulated sum.

The first and second accumulated sums may or may not be filtered. Then the difference between the filtered first accumulated sum and the filtered second accumulated sum is determined. This difference represents the timing skew estimate or timing skew indication.

The timing skew estimate is used to adjust the analog delay element. The analog delay element causes the timing skew of the sub analog-to-digital converter to be controlled, as directed by the timing skew estimate.

In FIG. 6, a multi-channel analog-to-digital converter system includes a reference analog-to-digital converter 700 and a sub-analog-to-digital converter 710, one of a plurality (M) of sub-analog-to-digital converters 770. The reference analog-to-digital converter 700 and the plurality of sub-analog-to-digital converters 770 receive an analog input and generate a digital output. The digital output of reference analog-to-digital converter 700 is delayed by a fixed delay circuit 720. The digital output of each of the plurality of analog-to-digital converters is delayed by a variable delay circuit. In the illustration of FIG. 6, for brevity sake, the digital output of sub analog-to-digital converter 710 is delayed by a variable delay circuit 730. A channel combiner 750 receives each delayed output and produces the appropriate digital output for the multi-channel analog-to-digital converter system.

As noted above, the multi-channel analog-to-digital converter system includes a timing or clock sequence detector circuit and a timing skew estimator circuit 760 which provides an estimate of the timing skew.

The clock sequence detector determines when the sub analog-to-digital converter 710 has taken a sample at t−1 that immediately precedes the sample taken by the reference channel, at t. When this condition is met, the timing skew estimator circuit 760 receives the output, from the reference analog-to-digital converter, that is the digital representation of the sample of the analog input taken at time t by the reference analog-to-digital converter 700. In addition, the timing skew estimator circuit 760 also receives the output from the sub analog-to-digital converter 710 that is the digital representation of the sample of the analog input taken at time t−1 by the sub analog-to-digital converter 710. The two digital outputs are then summed. The magnitude of the sum is then added to the sum of the previous magnitudes of the sums of adjacent samples where the sub analog-to-digital converter's sample of the analog input immediately precedes the sample of the analog input taken by the reference analog-to-digital converter. This result may be referred to as the first accumulated sum.

In addition, the clock sequence detector determines when the sub analog-to-digital converter 710 has taken a sample at t+1 that immediately follows the sample taken by the reference channel, at t. When this second condition is met, the timing skew estimator circuit 760 receives the output, from the reference analog-to-digital converter, that is the digital representation of the sample of the analog input taken at time t taken by the reference analog-to-digital converter 700. In addition, the timing skew estimator circuit 760 also receives the output from the sub analog-to-digital converter 710 that is the digital representation of the sample of the analog input taken at time t+1 by the sub analog-to-digital converter 710. The two digital outputs are then summed. The magnitude of the sum is then added to the sum of the previous magnitudes of the sums of adjacent samples where the sub analog-to-digital converter's sample of the analog input immediately follows the sample of the analog input taken by the reference analog-to-digital converter. This result may be referred to as the second accumulated sum.

The first and second accumulated sums may or may not be filtered. Then the difference between the filtered first accumulated sum and the filtered second accumulated sum is determined. This difference represents the timing skew estimate or timing skew indication.

The timing skew estimate is fed to a coefficient determination circuit 740. The coefficient determination circuit 740 generates coefficients to control the length of the delay created by the variable delay 730. The variable delay 730 shifts the effective the sample time such that the timing skew of the sub-analog-to-digital converter channel 710 matches that of the reference analog-to-digital converter channel 700.

In FIG. 7, a multi-channel analog-to-digital converter system includes a reference analog-to-digital converter 700 and a sub-analog-to-digital converter 710, one of a plurality (M) of sub-analog-to-digital converters 770. The reference analog-to-digital converter 700 and the sub-analog-to-digital converters 770 receive an analog input and generate a digital output. The digital output of reference analog-to-digital converter 700 is delayed by a fixed delay circuit 720. The digital output of each sub analog-to-digital converter is delayed by a variable delay circuit. In the illustration of FIG. 7, for brevity sake, the digital output of sub analog-to-digital converter 710 is delayed by a variable delay circuit 730. A channel combiner 750 receives each delayed output and produces the appropriate digital output for the multi-channel analog-to-digital converter system.

As noted above, the multi-channel analog-to-digital converter system includes a timing or clock sequence detector circuit and a timing skew estimator circuit 760 which provides an estimate of the timing skew.

The clock sequence detector determines when the sub analog-to-digital converter 710 has taken a sample at t−1 that immediately precedes the sample taken by the reference channel, at t. When this condition is met, the timing skew estimator circuit 760 receives the output, from the reference analog-to-digital converter, that is the digital representation of the sample of the analog input taken at time t by the reference analog-to-digital converter 700. In addition, the timing skew estimator circuit 760 also receives the output from the sub analog-to-digital converter 710 that is the digital representation of the sample of the analog input taken at time t−1 by the sub analog-to-digital converter 710. The two digital outputs are then summed. The magnitude of the sum is then added to the sum of the previous magnitudes of the sums of adjacent samples where the sub analog-to-digital converter's sample of the analog input immediately precedes the sample of the analog input taken by the reference analog-to-digital converter. This result may be referred to as the first accumulated sum.

In addition, the clock sequence detector determines when the sub analog-to-digital converter 710 has taken a sample at t+1 that immediately follows the sample taken by the reference channel, at t. When this second condition is met, the timing skew estimator circuit 760 receives the output, from the reference analog-to-digital converter, that is the digital representation of the sample of the analog input taken at time t taken by the reference analog-to-digital converter 700. In addition, the timing skew estimator circuit 760 also receives the output from the sub analog-to-digital converter 710 that is the digital representation of the sample of the analog input taken at time t+1 by the sub analog-to-digital converter 710. The two digital outputs are then summed. The magnitude of the sum is then added to the sum of the previous magnitudes of the sums of adjacent samples where the sub analog-to-digital converter's sample of the analog input immediately follows the sample of the analog input taken by the reference analog-to-digital converter. This result may be referred to as the second accumulated sum.

The first and second accumulated sums may or may not be filtered. Then the difference between the filtered first accumulated sum and the filtered second accumulated sum is determined. This difference represents the timing skew estimate or timing skew indication.

The timing skew estimate is fed to a coefficient determination circuit 740. The coefficient determination circuit 740 generates, in response to the summed signal and received signal information, coefficients to control the length of the delay created by the variable delay 730. The variable delay 730 shifts the effective sample time such that the timing skew of the sub-analog-to-digital converter channel 710 matches that of the reference analog-to-digital converter channel 700.

Figure 8:
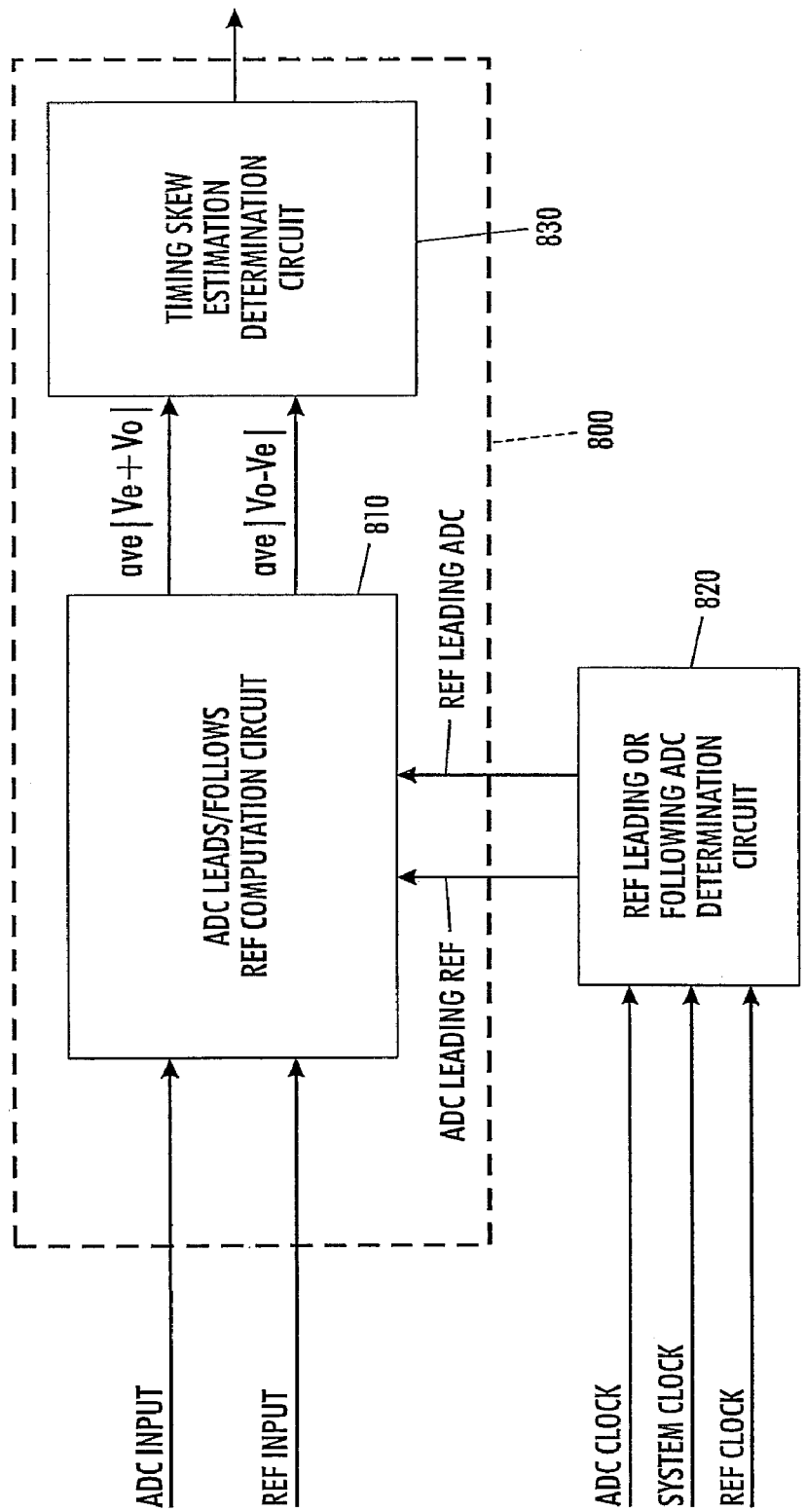
FIG. 8 is a block diagram illustrating a timing skew estimation circuit according to the concepts of the present invention.

FIG. 8 illustrates a block diagram of a timing skew estimation circuit suitable for use in a multi-channel time-interleaved ADC system that uses a non-sequential interleaving sequence. The timing skew estimation circuit includes a clock sequence detector 820 and a timing skew estimator 800.

The clock sequence detection circuit determines if the sample represented by the output of a reference analog-to-digital converter precedes the sample represented by the output a non-reference analog-to-digital converter or if the sample represented by the output of a reference analog-to-digital converter follows the samples represented by the output of a non-reference analog-to-digital converter.

When the specified sample timing arrangements are met, the computation circuit 810 determines first absolute values corresponding to the sum of the output of the reference analog-to-digital converter and the output of the non-reference analog-to-digital converter when the sample represented by the output of the reference analog-to-digital converter follows the sample represented by the output of a non-reference analog-to-digital converter. Moreover, the computation circuit 810 determines second absolute values corresponding to the sum of the output of the reference analog-to-digital converter and the output of the non-reference analog-to-digital converter when the sample represented by the output of the reference analog-to-digital converter precedes the sample represented by the output of a non-reference analog-to-digital converter. From these absolute values, the computation circuit 810 determines the average of the first absolute values and the average of the second absolute values.

As illustrated in FIG. 8, the timing skew estimator 800 includes a timing skew estimation determination circuit 830 that calculates a timing skew estimate value (ave|Ve+Vo|−ave|Vo+Ve|). Based on the timing skew estimate value, the timing skew estimation determination circuit 830 outputs a timing skew estimate signal.

In summary, it is determined if the current sample either immediately precedes the reference channel's sample or immediately follows the reference channel's sample by the clock sequence detection circuit 820. Depending upon the state of sample with respect to the reference sample, the appropriate pair-wise samples are operated upon by the computation circuit 810. The two results are passed to an accumulator or timing skew estimator 800 for further processing to determine the timing skew estimate.

By exploiting a non-sequential interleaving sequence in a time-interleaved analog-to-digital converter system along with a clock sequence detection block or a clock sequence indicator, two-channel timing skew estimators can be extended to time-interleaved analog-to-digital converter systems with any number of analog-to-digital converters. The present invention replaces the need for a fixed timing relationship between the channels with a variable timing relationship and a mechanism for advising the timing skew estimator when the estimator's required timing relationship is met such that the estimator can accept samples for processing.

While the above description applies to estimating timing skews and to the use of adjacent samples, the concepts of the present invention can be extended to estimating other parameters and to other sample-to-sample spacing relationships.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A time interleaved analog-to-digital converter system including an analog input, a clock input, and a digital output, comprising:
   a non-sequential channel selection circuit, operatively connected to said clock input, to generate channel selection signals;
   a plurality of analog-to-digital converters, operatively connected to said analog input, to said non-sequential channel selection circuit, and to said clock input, to receive said analog input, a channel selection signal, and a clock signal, each analog-to-digital converter being associated with a channel, each analog-to-digital converter receiving a different channel selection signal;
   a reference analog-to-digital converter, operatively connected to said non-sequential channel selection circuit, to said analog input, and to said clock input, to receive an analog input signal, a channel selection signal, and a clock signal;
   a plurality of clock sequence detection circuits, operatively connected to said non-sequential channel selection circuit, to receive a channel selection signal and the channel selection signal received by said reference analog-to-digital converter, each clock sequence detection circuit being associated with one of said plurality of analog-to-digital converters that receives the same channel selection signal;
   a plurality of timing skew estimation circuits, operatively connected to said reference analog-to-digital converter, to receive an output from said reference analog-to-digital converter and to generate a timing skew estimate, each timing skew estimation circuit being operatively connected to one of said plurality of clock sequence detection circuits and being associated with one of said plurality of analog-to-digital converters, each timing skew estimation circuit receiving an output from the associated analog-to-digital converter; and
   a selection circuit operatively connected to said plurality of analog-to-digital converters, said reference analog-to-digital converter, and said non-sequential channel selection circuit;
   said selection circuit selecting one output from said plurality of said analog-to-digital converters and said reference analog-to-digital converter to be provided to said digital output in response to said channel selection signals.

2. The time interleaved analog-to-digital converter system as claimed in claim 1, wherein said channel selection signals include the clock signal.

3. The time interleaved analog-to-digital converter system as claimed in claim 1, wherein said clock sequence detection circuit receives said clock signal.

4. The time interleaved analog-to-digital converter as claimed in claim 1, wherein each clock sequence detection circuit determines if the output of said reference analog-to-digital converter represents a sample that immediately preceded the sample represented by the output of the associated analog-to-digital converter, each clock sequence detection circuit determining if the output of said reference analog-to-digital converter represents a sample that immediately followed the sample represented by the output of the associated analog-to-digital converter.

5. The time interleaved analog-to-digital converter as claimed in claim 1, wherein each timing skew estimation circuit determines first absolute values corresponding to the sum of the output of said reference analog-to-digital converter and the output of the associated analog-to-digital converter when the sample represented by output of said reference analog-to-digital converter immediately follows the sample represented by the output of the associated analog-to-digital converter, each timing skew estimation circuit determines second absolute values corresponding to the sum of the output of said reference analog-to-digital converter and the output of the associated analog-to-digital converter when the sample represented by the output of said reference analog-to-digital converter immediately precedes the sample represented by the output of the associated analog-to-digital converter.

6. The time interleaved analog-to-digital converter as claimed in claim 1, wherein each timing skew estimation circuit determines first absolute values corresponding to the difference between the output of said reference analog-to-digital converter and the output of the associated analog-to-digital converter when the sample represented by output of said reference analog-to-digital converter immediately follows the sample represented by the output of the associated analog-to-digital converter, each timing skew estimation circuit determines second absolute values corresponding to the difference between the output of said reference analog-to-digital converter and the output of the associated analog-to-digital converter when the sample represented by the output of said reference analog-to-digital converter immediately precedes the sample represented by the output of the associated analog-to-digital converter.

7. The time interleaved analog-to-digital converter as claimed in claim 5, wherein each timing skew estimation circuit determines an average first absolute value and an average second absolute value.

8. The time interleaved analog-to-digital converter as claimed in claim 7, wherein each timing skew estimation circuit determines a timing skew correction signal based upon the average first absolute value and the average second absolute value.

9. The time interleaved analog-to-digital converter as claimed in claim 1, wherein each clock sequence detection circuit determines if the output of said reference analog-to-digital converter precedes the output of the associated analog-to-digital converter, each clock sequence detection circuit determining if the output of said reference analog-to-digital converter follows the output of the associated analog-to-digital converter.

10. A method for determining frequency and timing characteristics of the channels in a time interleaved analog to digital converter system comprising:
   (a) inputting an analog signal;
   (b) non-sequentially selecting the channels, one at a time to sample the analog signal and to generate a digital output signal based upon the sampled analog signal;
   (c) selecting one of the channels as a reference channel;

(d) determining a timing skew difference between the samples represented by the digital output signal of the reference channel and the samples represented by the digital output signal of one or more of the non-reference channels; and (e) generating a timing skew correction signal based upon the determined timing skew difference.

11. The method as claimed in claim 10, wherein one of the channels to generate digital output signals is non-sequentially selected based upon an individual sample of the inputted analog signal.

12. The method as claimed in claim 10, further comprising:

(f) determining if the sample represented by the digital output signal of the reference channel preceded the sample represented by the digital output signal of one of the non-reference channels;

(h) determining if the sample represented by the digital output signal of the reference channel followed the sample represented by the digital output signal of one of the non-reference channels.

13. The method as claimed in claim 10, further comprising:

(g) determining first absolute values corresponding to the sum of the digital output signal of the reference channel and an digital output signal of one of the non-reference channels when the sample represented by the digital output signal of the reference channel follows the sample represented by the digital output signal of one of the non-reference channels;

(h) determining second absolute values corresponding to the difference between the digital output signal of the reference channel and an digital output signal of one of the non-reference channels when the sample represented by the digital output signal of the reference channel precedes the sample represented by the digital output signal of one of the non-reference channels.

14. The method as claimed in claim 13, further comprising:

(i) determining an average first absolute value and an average second absolute value.

15. The method as claimed in claim 13, further comprising:

(j) determining a timing skew correction signal based upon the average first absolute value and the average second absolute value.

16. The method as claimed in claim 10, further comprising:

(g) determining if the sample represented by the digital output signal of the reference channel precedes the sample represented by the digital output signal of a first channel of a predefined pair of non-reference channels;

(h) determining if the sample represented by the digital output signal of the reference channel follows the sample represented by the digital output signal of a second channel of a predefined pair of non-reference channels.

17. A method for determining frequency and timing characteristics of the channels in a time interleaved analog to digital converter system comprising:

(a) inputting an analog signal;

(b) non-sequentially selecting the channels one at a time to sample the analog input signal and to generate a digital output signal based upon the sampled analog signal;

(c) selecting one of the channels as a reference channel;

(d) determining a frequency response difference between the samples represented by the digital output signal of the reference channel and the samples represented by the digital output signal of one or more of the non-reference channels; and (e) generating a frequency response correction signal based upon the determined frequency response difference.

18. The method as claimed in claim 17, wherein one of the channels to generate digital output signals is non-sequentially selected based upon an individual sample of the inputted analog signal.

19. The method as claimed in claim 17, further comprising:

(f) determining if the sample represented by the digital output signal of the reference channel preceded the sample represented by the digital output signal of one of the non-reference channels;

(h) determining if the sample represented by the digital output signal of the reference channel followed the sample represented by the digital output signal of one of the non-reference channels.

20. The method as claimed in claim 17, further comprising:

(g) determining first absolute values corresponding to the sum of the digital output signal of the reference channel and an digital output signal of one of the non-reference channels when the sample represented by the digital output signal of the reference channel follows the sample represented by the digital output signal of one of the non-reference channels;

(h) determining second absolute values corresponding to the difference between the output of the reference channel and an output of one of the non-reference channels when the sample represented by the output of the reference channel precedes the sample represented by the output of one of the non-reference channels.

21. The method as claimed in claim 20, further comprising:

(i) determining an average first absolute value and an average second absolute value.

22. The method as claimed in claim 20, further comprising:

(j) determining a frequency response correction signal based upon the average first absolute value and the average second absolute value.

23. The method as claimed in claim 17, further comprising:

(g) determining if the sample represented by the digital output signal of the reference channel precedes the sample represented by the digital output signal of a first channel of a predefined pair of non-reference channels;

(h) determining if the sample represented by the digital output signal of the reference channel follows the sample represented by the digital output signal of a second channel of a predefined pair of non-reference channels.

24. A multi-channel analog-to-digital converter, comprising:

a plurality of analog-to-digital converters to receive an analog input signal, each analog-to-digital converter being associated with a channel;

a reference analog-to-digital converter to receive an analog input signal;

a non-sequential channel selection circuit, operatively connected to said each analog-to-digital converter and said reference analog-to-digital converter, said non-sequential channel selection circuit controlling a selection of said analog-to-digital converters and said reference analog-to-digital converter to non-sequentially interleave the times at which said analog-to-digital converters and said reference analog-to-digital converter sample said analog input;

a clock sequence indication circuit to determine a timing relationship between a sample represented by the output of said reference analog-to-digital converter and the samples represented by the outputs of said analog-to-digital converters; and a plurality of timing skew estimation circuits operatively connected to said reference analog-to-digital converter, said non-sequential channel selection circuit, said clock sequence indication circuit and said analog-to-digital converters, each timing skew estimation circuit being associated with one of said analog-to-digital converters;

each timing skew estimation circuit receiving an output from said reference analog-to-digital converter, said associated analog-to-digital converter, and said clock sequence indication circuit;

each timing skew estimation circuit generating an associated timing skew estimation signal corresponding to a timing error between said reference analog-to-digital converter and said associated analog-to-digital converter when the timing relationship between the sample represented by the output of said reference analog-to-digital converter and the sample represented by the output of said associated analog-to-digital converter is a predetermined timing relationship.

25. The multi-channel analog-to-digital converter as claimed in claim 24, wherein the predetermined timing relationship is when the sample represented by the output of said reference analog-to-digital converter immediately precedes the sample represented by the output of said associated analog-to-digital converter.

26. The multi-channel analog-to-digital converter as claimed in claim 24, wherein the predetermined timing relationship is when the sample represented by the output of said reference analog-to-digital converter immediately follows the sample represented by the output of the associated analog-to-digital converter.

27. The multi-channel analog-to-digital converter as claimed in claim 24, wherein the predetermined timing relationship is when the sample represented by the output of said reference analog-to-digital converter precedes the sample represented by the output of said associated analog-to-digital converter by a predetermined period of time.

28. The multi-channel analog-to-digital converter as claimed in claim 24, wherein the predetermined timing relationship is when the samples represented by the output of said reference analog-to-digital converter precedes the samples represented by the output of said associated analog-to-digital converter by a predetermined period of time.

29. The multi-channel analog-to-digital converter as claimed in claim 24, wherein the predetermined timing relationship is when the sample represented by the output of said reference analog-to-digital converter follows the sample represented by the output of the associated analog-to-digital converter by a predetermined period of time.

30. The multi-channel analog-to-digital converter as claimed in claim 24, wherein the predetermined timing relationship is when the samples represented by the output of said reference analog-to-digital converter follows the samples represented by the output of said associated analog-to-digital converter by a predetermined period of time.

31. The multi-channel analog-to-digital converter as claimed in claim 24, wherein each timing skew estimation circuit determines first absolute values corresponding to the sum of the output of said reference analog-to-digital converter and the output of said associated analog-to-digital converter when the timing relationship between the sample represented by the output of said reference analog-to-digital converter and the sample represented by the output of said associated analog-to-digital converter is a first predetermined timing relationship.

32. The multi-channel analog-to-digital converter as claimed in claim 24, wherein each timing skew estimation circuit determines second absolute values corresponding to the difference between the output of said reference analog-to-digital converter and the output of the associated analog-to-digital converter when the timing relationship between the sample represented by the output of said reference analog-to-digital converter and the sample represented by the output of said associated analog-to-digital converter is a second predetermined timing relationship.

33. The multi-channel analog-to-digital converter as claimed in claim 24, further comprising:

a timing correction circuit operatively connected to said timing skew estimation circuits;

said timing correction circuit correcting a timing error in said associated analog-to-digital converter in response to said associated timing skew estimation signal.

34. The multi-channel analog-to-digital converter as claimed in claim 24, further comprising:

a timing correction circuit operatively connected to said timing skew estimation circuits;

said timing correction circuit including a variable delay connected to an output of said associated analog-to-digital converter;

said variable delay being adjusted in accordance with said associated timing skew estimation signal.

35. A method for estimating matching characteristics of the channels in a time interleaved analog to digital converter system, comprising:

(a) inputting an analog signal;

(b) non-sequentially selecting the channels one at a time to sample the analog input signal and to generate a digital output signal based upon the sampled analog signal;

(c) selecting one of the channels as a reference channel; and (d) determining channel matching characteristics, based upon a fixed timing relationship, between the samples represented by the digital output signal of the reference channel and the samples represented by the digital output signal of one or more of the non-reference channels.

36. A method for correcting channel mismatches between the channels in a time interleaved analog to digital converter system, comprising:

(a) inputting an analog signal;

(b) non-sequentially selecting the channels one at a time to sample the analog input signal and to generate a digital output signal based upon the sampled analog signal;

(c) selecting one of the channels as a reference channel; and (d) detecting a channel mismatch, based upon a fixed timing relationship, between the samples represented by the digital output signal of the reference channel and the samples represented by the digital output signal of one or more of the non-reference channels; and (e) correcting the detected channel mismatch between the samples represented by the digital output signal of the reference channel and the samples represented by the digital output signal of one or more of the non-reference channels.

37. A method for correcting channel mismatches between the channels in a time interleaved analog to digital converter system, comprising:

(a) inputting an analog signal;

(b) non-sequentially selecting the channels one at a time to sample the analog input signal and to generate a digital output signal based upon the sampled analog signal;

(c) selecting one of the channels as a reference channel; and (d) estimating a channel mismatch, based upon a fixed timing relationship, between the samples represented by the digital output signal of the reference channel and the samples represented by the digital output signal of one or more of the non-reference channels; and (e) correcting the estimated channel mismatch between the samples represented by the digital output signal of the reference channel and the samples represented by the digital output signal of one or more of the non-reference channels.

38. A method for detecting differences between the channels in a time interleaved analog to digital converter system, comprising:

(a) inputting an analog signal;

(b) non-sequentially selecting the channels one at a time to sample the analog input signal and to generate a digital output signal based upon the sampled analog signal;

(c) selecting one of the channels as a reference channel; and (d) determining a difference, based upon a variable timing relationship, between the samples represented by the digital output signal of the reference channel and the samples represented by the digital output signal of one or more of the non-reference channels.

* * * * *